United States Patent [19]
Pedroni et al.

[11] Patent Number: 5,386,384
[45] Date of Patent: Jan. 31, 1995

[54] PARALLEL CCD MEMORY CHIP AND METHOD OF MATCHING THEREWITH

[75] Inventors: Volnei A. Pedroni, Pasadena; Amnon Yariv, San Marino; Aharon J. Agranat, Pasadena, all of Calif.

[73] Assignee: California Institute of Technology, Pasadena, Calif.

[21] Appl. No.: 28,124

[22] Filed: Mar. 9, 1993

[51] Int. Cl.⁶ .................. G11C 19/28; H03K 23/46
[52] U.S. Cl. .................................. 365/183; 377/60; 377/62; 377/63
[58] Field of Search ............. 365/183; 257/238, 239; 377/57, 60, 62, 63

[56] References Cited

U.S. PATENT DOCUMENTS

| | | | |
|---|---|---|---|
| 4,065,756 | 12/1977 | Panigrahi | 365/183 |
| 4,306,300 | 12/1981 | Terman et al. | 365/183 X |
| 4,660,176 | 8/1987 | Narabu et al. | 365/183 |
| 4,760,558 | 7/1988 | Berger et al. | 365/183 |
| 4,766,332 | 8/1988 | Pelgrom et al. | 307/358 |
| 4,987,558 | 1/1991 | Slob | 365/183 |

Primary Examiner—Eugene R. LaRoche
Assistant Examiner—Son Dinh
Attorney, Agent, or Firm—Leonard Tachner

[57] ABSTRACT

A fully parallel CCD memory chip of N address lines which detects in just one clock cycle, a perfect match between an input pattern and any of a plurality of stored patterns and also detects in less than (N+1)-comparison cycles and still just one XOR operation, the best matching in case a perfect one does not exist. The chip disclosed herein has a fully parallel architecture in which an input word is compared to all stored words at one time. A preferred embodiment of the invention uses a four phase CCD, wherein each stored word occupies one row of the CCD and each such bit of each such word occupies two cells. Where perfect matches exist, only one comparison clock cycle is needed to compare the input word with all stored words and where there is no perfect match, the best match will be detected on a subsequent comparison pulse. Charge packets represent binary words generated by external pulses that are applied to the chip through data input lines and then are compared to the data applied to the address lines. The sensing is done directly on the cells in a non-destructive sensing process in parallel, rather than at the end of each row.

7 Claims, 2 Drawing Sheets

PARALLEL CCD MEMORY CHIP AND METHOD OF MATCHING THEREWITH

TECHNICAL FIELD

The present invention relates generally to the field of charge coupled devices and more specifically to a fully parallel CCD memory chip which may be advantageously used for matching between an digital input pattern and any of a plurality of stored patterns for detecting perfect matches or for detecting the best matching in a case where a perfect match does not exist. Such a memory chip is suitable for applications involving pattern recognition, Kanerva memories, data decoders (Viterbi) and other systems that require peak detection or Hamming distance calculation.

BACKGROUND ART

The retrieval of data from a conventional memory, based upon the matching of a stored pattern with a given one, is a very time-consuming task. One way of significantly reducing the time involved in providing such a matching capability is to use parallel processing in which an input word may be compared to a plurality of stored words at the same time. CCD devices are especially appropriate for parallel processing. Such devices consist basically of long rows of electrodes which move charge packets from one end of the row to another or back and forth along the row. At one end of the row is a charge injecting device, normally a diode and a few control gates. At the other end of the row is a dump diode which removes the charge from the chip. The other main component is a charge sensing device which detects the charge packets before they are dumped, such as in video cameras or in parallel over the whole row in a parallel processing application. The use of CCD technology for parallel processing is not new per se. Thus for example, CCD's are shown used in a parallel processing application for vector-matrix multiplication in an article entitled "A Parallel Analog CCD/CMOS Neural Network IC" by Neugebauer and Yariv in the proceedings of the IJCNN July, 1991 and as described in an article entitled "The CCD Neural Processor: A Neural Network Integrated Circuit with 65536 Programmable Analog Synapses" by Agranat, Neugebauer, Nelson and Yariv, IEEE Transactions on Circuits and Systems, Volume 37, No. 8, August, 1990, Page 1073-1075. However, the applicants herein know of no prior art disclosure for using a parallel processing CCD for pattern matching and the like as disclosed herein.

SUMMARY OF THE INVENTION

The present invention comprises a fully parallel CCD memory chip of N address lines which detects in just one clock cycle, a perfect match between an input pattern and any of a plurality of stored patterns and also detects in less than (N+1)-comparison cycles, with still just one XOR operation, the best matching in case a perfect one does not exist. The chip disclosed herein has a fully parallel architecture in which an input word is compared to all stored words at one time. If there is among the stored words, one that perfectly matches the input, i.e., with Hamming distance d=0 from it, the match will be detected in the first clock pulse of the comparison cycle. Otherwise, the best matching, i.e., the word with the $d_{min}$ will be detected during the $(d_{min}+1)$ pulse where d is less than or equal to N. A preferred embodiment of the invention uses a four phase CCD, wherein each stored word occupies one row of the CCD and each such bit of each such word occupies two cells. Therefore, for an N-bit word, a 2N-cell row is utilized. Hence, in the case of a four phase CCD which is disclosed herein as the currently preferred embodiment, each row is composed of 8N electrodes. If the bit to be stored is a 1, a charge packet is stored in the cell on the left of the two cells corresponding to that bit, while nothing (a fat zero, in fact) is stored in the cell on the right. If the bit to be stored is zero, the charge packet is stored on the cell on the right of the two cells corresponding to that bit, while nothing is stored in the cell on the left.

With the current technology, the expected upper limit of row length is around 256 cells (128 bits) per row. However, the input vector and its best matching vector are expected to have very few bits in disagreement, allowing the use of the dynamic range of the row output to be optimized so that much longer rows can be employed. The number of rows depends only on the chip size. For example, a 4 centimeter by 6 centimeter die can accommodate a 128×128 array in a 2.0 micron process. However, the architecture is scalable, thus permitting chips to be connected in a stacked configuration for increased capability in regard to the number of words that can be accommodated. The speed depends on the accuracy desired at the output, for long vectors (128 bits), it is typically below 5 MHz.

In operation, during the memory write period, all of the electrodes of the CCD are connected to their corresponding clock phases so that the charge packets are moved under the corresponding electrodes E2 of each column. During the comparison cycle, a pattern is presented to the chip. Electrode E4 is initially precharged to a positive voltage and then left floating. The comparison is done by moving charge from E2 to E4. If E2 is pulsed to zero, the charge packet under E2 is dumped toward E4. The more charge that is moved under E4, the more its voltage drops. If there is disagreement between the stored bit and the input bit, a packet of charge moved towards E4 is full, thereby dropping the voltage under E4 for that row. On the other hand, if there is agreement between the stored bit and the input bit, the packet under E2 is empty, in which case there is no change on the voltage of E4. The output of the chip architecture consists of a plurality of sense amplifiers, with feedback capacitors to improve linearity, followed by comparators, one for each row. One input to the comparator is the charge at E4 of all the cells in that row and the other input to the comparator is a reference voltage. The reference voltage is set slightly above the pre-charge voltage at the first clock cycle so that all of the comparators carry initially a zero output. If there is a perfect match after the cycle, one of the comparators will stay at zero and its address will be decoded at the output. However, if all are on, indicating that there has been no match during that clock cycle, the reference voltage is increased by the amount corresponding to one bit of disagreement and so on until the best matching is found. After the comparison is completed, all E4 electrodes are clocked to zero in order to move the charge packets back to E2 in preparation for the next input word. Therefore, only one operation on the charge packets is needed to compare the input word with all stored words. Furthermore, it will be seen that the charge packets represent binary words generated by external pulses that are applied to the chip through data input lines and then are compared to the data applied to the address lines. The sensing is done directly on the cells in a non-destructive sensing process in parallel, rather than at the end of each row.

OBJECT OF THE INVENTION

It is therefore a principal object of the present invention to provide a fully parallel CCD memory chip for pattern matching of an input word with all stored words at one time.

It is an additional object of the present invention to provide a parallel CCD memory chip having a plurality of stored words therein and means for comparing an input word with all such stored words simultaneously, whereby a perfect match therebetween is detected in one clock cycle and wherein if no perfect match exists, a best match is detected in subsequent clock cycles, but still with just one XOR operation.

It is still an additional object =of the present invention to provide a CCD memory chip capable of operating in a parallel mode for matching a stored pattern and an input pattern in a minimum amount of time.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which.

DETAILED DESCRIPTION OF A PREFERRED EMBODIMENT

Figure 1:
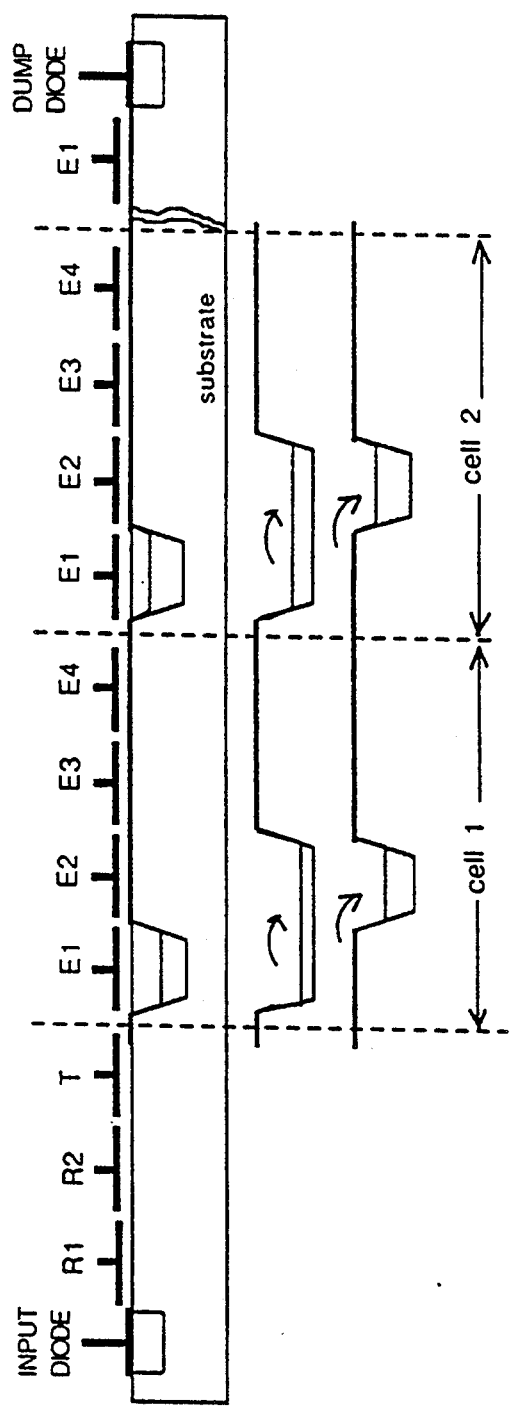
FIG. 1 is a pictorial diagram illustrating the basic charge transfer principal in CCDs and particularly in a four phase CCD used in a disclosed embodiment of the present invention.

Referring now first to FIG. 1 which illustrates the basic operation principle of a four phase CCD, it will be seen that the charge packets are generated by applying an appropriate differential voltage on electrodes R1 and R2 and then pulsing the input diode D to low. The transfer gate T then transfers the charge to the first electrode E1 of the row, and the process goes as follows. During phase 1, the first electrode of the cell is at a high voltage, such as 5 volts and the charge packet sits in the potential well under it. The other electrodes are at low voltage, such as zero volts. Next, electrode E2 goes on, causing the electric charges to spread under electrodes E1 and E2. Then, by turning E1 off, the whole charge moves under E2. At the same time, the charge packet that was under E1 of the next cell, moves to under E2 and so forth for all cells in the row. By repeating this process, it is possible to easily move charge from one end of the row to another. In the present invention, the charge packets represent binary words that are compared to the data applied to the address lines. The sensing is done directly on the cells in a non-destructive manner in parallel, rather than at one end of the row.

Figure 2:
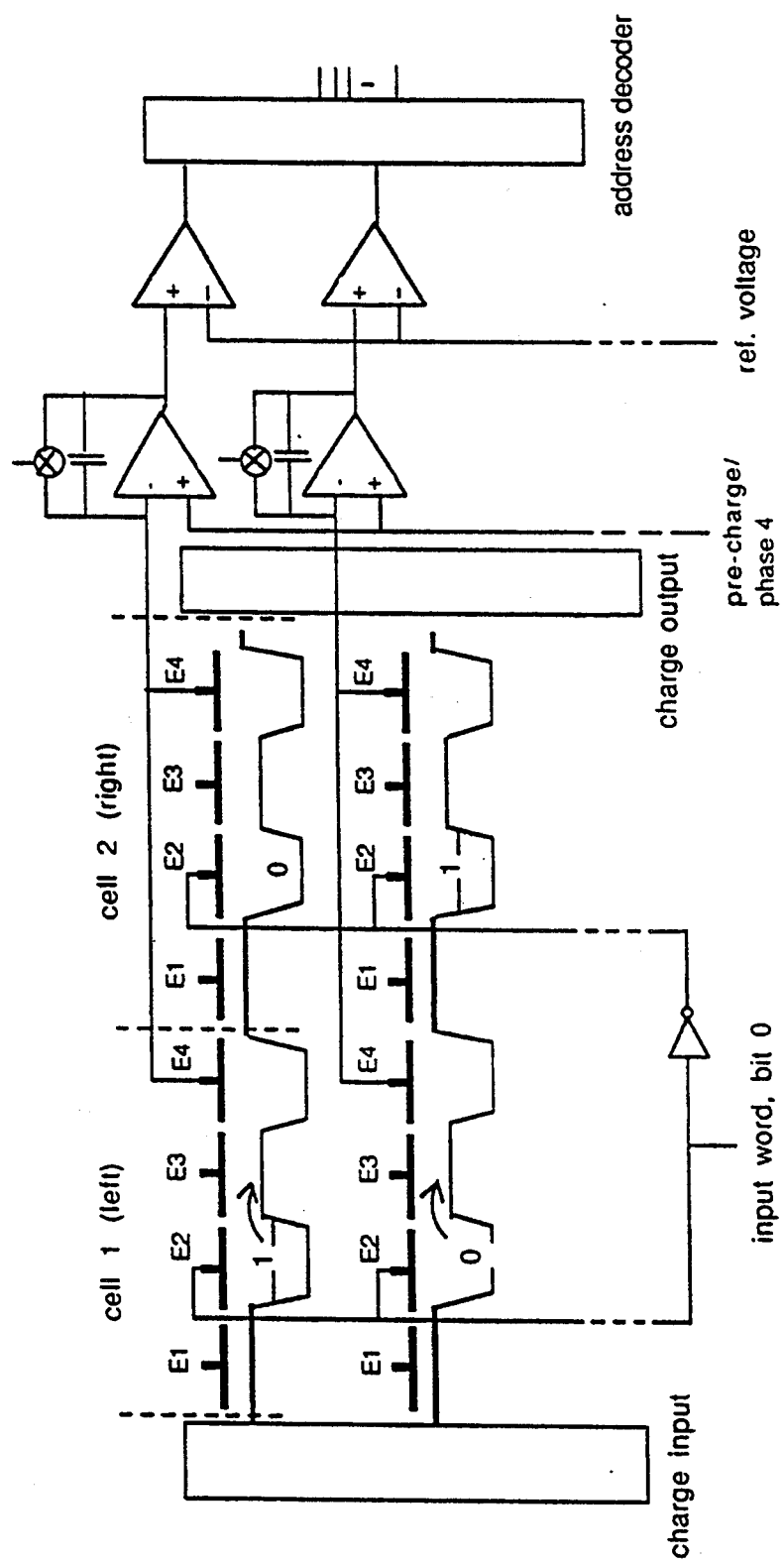
FIG. 2 is a pictorial diagram illustrating the basic architecture of the parallel memory chip of the present invention.

FIG. 2 illustrates the overall architecture of the chip. Every word is stored in one row and every bit occupies two cells. Therefore, for an N-bit word, a 2N-cell row is needed. Hence, in a four phase CCD, as is the case for the embodiment illustrated, each row is composed of 8×N electrodes. In addition, the CCD provides for conventional stored charge input, but unconventional matching word input, as well as a comparator for each row and an address decoder to identify a row which produces a particular comparator output. If the bit to be stored is a 1, a charge packet is stored in the cell on the left, while nothing (fat zero) is stored in the cell on the right. If it is a zero, a charge packet is stored in the cell on the right, while nothing is stored in the cell on the left. FIG. 2 shows the first two rows (words) and the first two cells (first bit) of each word. In this example, the upper stored bit is a one, while the lower stored bit is a zero. The injection of charge to the chip and sensing of the charge packets is done in a conventional manner.

During the memory-write period, all electrodes are connected to the corresponding clock phases and so the charge packets are moved under the corresponding electrodes (E2 of every column). During the comparison cycle, a pattern is presented to the chip. FIG. 2 shows only its first bit. E4 is initially precharged to a positive voltage and then left floating. The comparison is done by moving charge from E2 to E4. To do this, E1 is set at a low voltage, such as zero volts, while E3 is set at a voltage slightly higher than that. If E2 is pulsed to zero, the charge packet will be dumped towards E4. Notice that the more charge that is moved to under E4, the more its voltage drops. In FIG. 2, if the input bit is a zero for example, the cell on the left will be the affected one, i.e., the charge under E2 of that cell will be transferred to under E4. The first word has a 1 stored, so a charge packet (disagreement) will be moved, dropping the voltage of that row electrode. The second word has a zero in its first bit, thus an empty packet (agreement) will be moved in which case there will be no change on the voltage of E4.

After this XOR operation between the input word and all the stored words, the output comparators are enabled. Suppose that the initial voltage of E4 was V and that for every bit in disagreement it drops by Y volts. The reference voltage is set at $V+Y/2$ in the first comparison clock cycle. If there is a perfect match, all of the comparators but one will be on and so its address will be decoded at the output. If none of the comparators is at zero, the reference voltage is set at $V+3Y/2$ (one bit of disagreement), and so on, until the best matching is found. The comparators can also be clocked with a saw-tooth-like pulse with an initial voltage higher than V, moving towards $V_{cc}$ in which case the first electrode voltage to be reached (best matching) will produce an output. After the comparison is done, all E4 electrodes are clocked to zero in order to move the charge packets back to E2 to get ready for the next input word.

The maximum size (number of bits) of a row depends on the accuracy of the processor. Typical results obtained in an actual reduction to practice with two micrometer CCD/CMOS technology have been of the order of 6-7 bits, which means that a 64 to 128 bit long row can be realized. Cells of about 24 micrometers×30 micrometers and the clock frequencies of 1-4 megahertz with a refresh time of a few milliseconds have been used. As previously indicated, parallel CCD memory chips of the invention may be stacked to increase capacity.

It will now be apparent that what has been described herein comprises a fully parallel memory chip employing CCD technology and which is suitable for applications where parallel processing is required, such as in pattern matching and Hamming distance calculations. Those having skill in the art to which the present invention pertains, will now as a result of the applicants' teaching herein, perceive various modifications and additions which may be made to the invention. By way of example, the precise architecture employed herein, as well as the use of a four phase CCD disclosed herein in regard to the preferred embodiment, may be readily altered by using other architectures and other CCD configurations. Accordingly, all such modifications and additions which may be made to the disclosed exemplary embodiment are deemed to be within the scope of the invention which is to be limited only by the claims appended hereto and their equivalents.

We claim:

1. A parallel CCD memory comprising:

a plurality of memory cell rows each such row having at least one pair of cells, each such cell pair having at least two sets of sequentially arrayed electrodes for transferring charge in accordance with the magnitudes of voltages applied to said electrodes; each such cell pair having a binary one or zero stored therein in the form of a charge in a region corresponding to a selected first one of said electrodes; each said row having a voltage comparator having one input terminal connected to a reference voltage source and having another input terminal connected to at least a second one of said electrodes; and an address decoder for indicating which of said memory cell row comparators produces an output indicative of a substantially zero voltage difference between its corresponding input terminals;

means for applying input voltages to said selected first one of said electrodes in each said cell pair of each said row, said input voltages representing an input binary one or zero to be compared with the binary one or zero stored in said cell pair, the voltage at said second one of said electrodes being dependent upon whether said input binary one or zero is the same as or different from said stored binary one or zero.

2. The CCD memory recited in claim 1 wherein each such cell pair comprises two sets of four electrodes each and wherein each such row comprises at least four of said cells pairs.

3. The CCD memory recited in claim 2 wherein said first one of said electrodes is the second electrode of each such set and wherein said second one of said electrodes is the fourth electrode of each such set.

4. The CCD memory recited in claim 1 further comprising means for decreasing said voltage at said second one of said electrodes when said input binary one or zero is different from said stored binary one or zero and for not decreasing said voltage at said second one of said electrodes when said input binary one or zero is the same as said stored binary one or zero.

5. An electrical memory apparatus for simultaneously comparing an input word with a plurality of stored words to determine whether a perfect match exists between the input word and any of the stored words and to indicate the best match therebetween if no perfect match exists; the memory apparatus comprising:

a charge coupled device integrated circuit chip configured as a plurality of rows of memory cell pairs, each such cell pair being implemented as first and second 4-phase CCD row structures each having four sequentially arrayed electrodes E1, E2, E3 and E4 and corresponding charge wells;

each such cell pair storing a binary digit of one of said stored words, the logic level of which is determined by a charge stored under electrode E2 of either the first or second structure;

means for introducing a voltage to electrode E2 of said first and second structures of each said cell pair, said voltage corresponding to the logic level of a binary digit of said input word; the charge under electrode E2 of each said structure being selectively transferred to a well under corresponding electrode E4 depending upon the magnitude of the voltage introduced at electrode E2 and the charge stored under electrode E2; a voltage at electrode E4 being decreased depending upon whether there is said selective transfer of charge from under electrode E2; and means for sensing and comparing voltage changes at each of the electrodes E4 upon each such transfer.

6. The memory apparatus recited in claim 5 wherein said means for sensing comprises a plurality of comparators, one such comparator for each said row of said memory cell rows on said chip, each comparator having one input connected to each electrode E4 of all of said cell pairs in a row and having another input connected to a selectively variable voltage source for comparing the voltage at electrodes E4 with said source's voltage.

7. The memory apparatus recited in claim 6 further comprising means for restoring the charge transferred to under electrodes E4 of each said cell pair to the well under electrodes E2 of the corresponding cell pair after sensing the voltage change, if any, at corresponding electrodes E4.

* * * * *